(12) United States Patent
Matsumoto et al.

(10) Patent No.: US 7,604,154 B2
(45) Date of Patent: Oct. 20, 2009

(54) THERMOSETTING FLUX AND SOLDER PASTE

(75) Inventors: Kazutaka Matsumoto, Kanagawa-ken (JP); Masahiro Tadauchi, Kanagawa-ken (JP); Izuru Komatsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 11 days.

(21) Appl. No.: 11/756,714

(22) Filed: Jun. 1, 2007

(65) Prior Publication Data

US 2007/0221712 A1    Sep. 27, 2007

Related U.S. Application Data

(62) Division of application No. 10/913,370, filed on Aug. 9, 2004, now abandoned.

(30) Foreign Application Priority Data

Aug. 8, 2003   (JP) .................... 2003-289645

(51) Int. Cl.
 *B23K 31/02* (2006.01)
 *B23K 35/34* (2006.01)
(52) U.S. Cl. ................. 228/248.1; 148/24
(58) Field of Classification Search ............. None
See application file for complete search history.

(56) References Cited

U.S. PATENT DOCUMENTS

| | | | |
|---|---|---|---|
| 4,404,447 A * | 9/1983 | Kitamura et al. ............ 219/64 |
| 5,076,487 A * | 12/1991 | Bandyopadhyay et al. .. 228/219 |
| 5,167,729 A * | 12/1992 | Takemoto et al. ............ 148/23 |
| 5,190,208 A * | 3/1993 | Turner ........................ 228/207 |
| 5,281,281 A * | 1/1994 | Stefanowski ................ 148/23 |
| 5,334,260 A * | 8/1994 | Stefanowski ................ 228/223 |
| 5,989,362 A * | 11/1999 | Diamant et al. .............. 148/23 |
| 6,402,013 B2 * | 6/2002 | Abe et al. .................... 228/223 |
| 6,736,907 B2 * | 5/2004 | Taguchi et al. .............. 148/23 |
| 6,915,944 B1 * | 7/2005 | Takaya et al. ............... 228/223 |
| 7,182,241 B2 * | 2/2007 | Yamashita et al. ........... 228/223 |
| 7,201,304 B2 * | 4/2007 | Yamashita et al. ........... 228/224 |
| 7,344,061 B2 * | 3/2008 | Yamashita et al. ........ 228/180.22 |
| 2002/0095783 A1 * | 7/2002 | Kirsten ......................... 29/841 |
| 2003/0121564 A1 * | 7/2003 | Taguchi et al. .............. 148/25 |
| 2003/0221748 A1 * | 12/2003 | Arzadon et al. .............. 148/23 |
| 2004/0026484 A1 * | 2/2004 | Yamashita et al. ........ 228/180.22 |
| 2004/0250919 A1 * | 12/2004 | Saito et al. .................. 148/25 |
| 2005/0028887 A1 * | 2/2005 | Yamashita et al. ........... 148/24 |
| 2005/0029334 A1 * | 2/2005 | Yamashita et al. .......... 228/248.1 |
| 2005/0029667 A1 * | 2/2005 | Yamashita et al. ............ 257/772 |
| 2006/0194920 A1 * | 8/2006 | Capote et al. ................. 524/779 |
| 2008/0066830 A1 * | 3/2008 | Gunji et al. .................. 148/23 |
| 2008/0073414 A1 * | 3/2008 | Saito et al. ................... 228/244 |

FOREIGN PATENT DOCUMENTS

| | | |
|---|---|---|
| CN | 1161266 A | 10/1997 |
| JP | 3-184695 | 8/1991 |
| JP | 4-143093 | 5/1992 |
| JP | 11-172353 | 6/1999 |
| JP | 11-172354 | 6/1999 |
| JP | 2000-290617 | 10/2000 |
| JP | 2001-138089 | 5/2001 |
| JP | 2001-143529 | 5/2001 |
| JP | 2001-219294 | 8/2001 |
| JP | 2002-120089 | 4/2002 |

OTHER PUBLICATIONS http://en.wikipedia.org/wiki/Bisphenol_A.
http://en.wikipedia.org/wiki/Phthalic_anhydride.

* cited by examiner

*Primary Examiner*—Kiley Stoner
(74) *Attorney, Agent, or Firm*—Oblon, Spivak, McClelland, Maier & Neustadt, L.L.P.

(57) ABSTRACT

The invention aims to provide a thermosetting flux suitable for solder bonding of a semiconductor element and an electronic part and making solder bonding with a high bonding strength and a high heat resistant strength at a high temperature possible and a paste containing the flux and a non-lead type solder paste and with respect to the thermosetting flux, an epoxy resin, a hardening agent, and at least one of rosin derivatives having functional groups reactive on the epoxy resin and selected from maleic acid-modified rosin, a fumaric acid-modified rosin, and acrylic acid-modified rosin are used. The flux can be used in form of a solder paste while being mixed and kneaded with the non-lead type solder alloy powder.

9 Claims, No Drawings

THERMOSETTING FLUX AND SOLDER PASTE

CROSS-REFERENCE TO RELATED APPLICATION

This application is a divisional of Ser. No. 10/913,370, filed on Aug. 9, 2004, now abandoned.

This application is based upon and claims the benefit of priority from the prior Japanese Patent Application No. 2003-289645, filed on Aug. 8, 2003; the entire contents of which are incorporated herein by reference.

FIELD OF THE INVENTION

The invention relates to a thermosetting flux suitable for solder bonding of electronic parts of a semiconductor device and a solder paste using the flux.

DESCRIPTION OF THE RELATED ART

In assembly of a semiconductor device, a mounting step of mounting a semiconductor element at a prescribed part on a lead frame or a resin substrate is one of important steps affecting the long term reliability of elements. Conventionally, as a mounting method, a solder mounting method using a low melting point alloy (solder) and a resin mounting method using a resin paste containing mainly a thermosetting resin such as an epoxy resin have been employed. Especially, in the case of a semiconductor element such as a power element required to have a heat releasing property, a solder mounting method using a high temperature solder mainly containing 90% or more lead has been employed.

However, in recent years, along with increase of the concerns of global environmental issues, non-lead type solders have been drawing attention. With respect to electronic apparatuses, production of products using lead-type ones and their import and export become subjects to legal regulation and accordingly, urgent countermeasure is needed.

Under such a situation, as non-lead type high temperature solder materials to be used for electronic apparatuses, Zn—Al—Mg type solders (reference to Japanese Patent Application Laid-Open No. 11-172354), Zn—Al—Ge type solder (reference to Japanese Patent Application Laid-Open No. 11-172353) and the like have proposed. However, any compositions are unsatisfactory in the processibility and further the compositions contain elements easy to be oxidized, so that they are inferior in the wettability and unsuitability for practical uses.

On the other hand, Sn—Cu type solders as a non-lead type high temperature solder material have been supposed possible. The Sn—Cu type solders have no problem in oxidation and are excellent in wettability, however they have a problem in the brittleness and are thus unsuitable for practical use. In such a manner, presently, there is no usable non-lead type solder material as a high temperature solder.

To solve the above-mentioned problem, it has been discussed whether it is possible or not to use a conductive adhesive as a substituting material for the high temperature solder. On the other hand, not only as a solder mounting material, but also as a solder-substituting bonding material, it has been tried to use the conductive adhesives for assembly of general electron apparatus substrates (reference to Japanese Patent Application Laid-Open No. 2000-290617).

The conductive adhesive is produced by mixing conductive filler such as silver, gold, copper, nickel, carbon or the like and a binder such as an epoxy resin, a phenolic resin, a polyester resin, an acrylic resin or the like at a prescribed ratio and kneading them.

However, in order to attain conductivity by the conductive adhesive as high as that by conventional soldering, those containing nickel or carbon as the conductive filler are unsatisfactory and presently, those containing a noble metal powder of such as silver, gold or the like as the conductive filler have to be used. However, silver and gold cost very high as compared with the cost of a general solder material (mainly containing tin) and that becomes an obstacle to use of the conductive adhesive besides the technical problems. Also, to use the conductive adhesive as the mounting material for a power element, there is another problem that the thermal conductivity is insufficient. Nevertheless, soldering is best for bonding a semiconductor device or an electronic part.

As known well, a flux is used for soldering. The main functions of the flux are to clean the solder-bonding part, to prevent oxidation of a metal, and to improve the wettability of a solder. A conventional flux is an auxiliary agent for making the soldering easy by such functions and it does nothing to do with the adhesion of the soldered part after the soldering and accordingly, the bonding strength is exclusively depending on the fusion bonding of the solder metal. In the solder bonding using a common non-lead type solder material with a melting point of 250° C. or lower, the heat resistant strength and the bonding strength are not necessarily sufficient. Particularly, with respect to a semiconductor element, in the wire bonding after mounting the semiconductor element or the second time or later soldering of a double-mounted type substrate bearing parts, the solder material may be re-melted when it is heated to 250° C. or higher to result in an undesirable consequence that the bonded part of the semiconductor element or the electronic part is separated or dropped.

Accordingly, in the case of carrying out solder bonding of the semiconductor element or the electronic part, it is needed to strengthen the bonding strength of the element or the electronic part.

To strengthen the bonding of the electronic part at the time of above-mentioned soldering, a flux for thermosetting solder obtained by adding a thermosetting resin to a rosin type flux is disclosed (reference to Japanese Patent Application Laid-Open No. 2001-219294). The flux can firmly strengthen an electronic part by owing to hardening of the thermosetting resin in the flux at the time of soldering and combination of the bonding by the solder and the bonding of the thermosetting resin. However, this technique is based only on addition of a conventional rosin to the thermosetting resin and the resin is not reacted with the thermosetting resin but simply mixed with and exists in the thermosetting resin and therefore, the heat resistant strength is not sufficient, so that in the case of carrying out soldering at a high temperature for a non-lead type solder, the bonding part is separated to result in deterioration of the reliability of the electronic apparatuses.

SUMMARY OF THE INVENTION

The invention has been accomplished in consideration of the above-mentioned problems and aims to provide a thermosetting flux suitable for solder bonding of a semiconductor element and an electronic part and capable of firmly bonding an electronic part to a part-mounted substrate simultaneously with soldering and maintaining stably bonding for a long duration and a non-lead type solder paste using the thermosetting flux.

The first aspect of the invention provides a thermosetting flux containing as indispensable components, an epoxy resin, a hardening agent, and a rosin derivative having a functional group reactive on the epoxy resin and which is at least one compound selected from a maleic acid-modified rosin, fumaric acid-modified rosin, and acrylic acid-modified rosin.

The second aspect of the invention provide a solder paste comprising a thermosetting flux containing as indispensable components, an epoxy resin, a hardening agent, and a rosin derivative having a functional group reactive on the epoxy resin and which is at least one compound selected from a maleic acid-modified rosin, a fumaric acid-modified rosin, and acrylic acid-modified rosin and a non-lead type solder alloy powder as well.

DETAILED DESCRIPTION OF THE INVENTION

A thermosetting flux according to an embodiment of the invention contains thermosetting resin components comprising an epoxy resin and a hardening agent and a rosin derivative having the flux function as indispensable components, so that excellent solderability can be provided and since the epoxy resin in the flux functions as an adhesive while being hardened at the time of soldering, an element or a part can firmly be fixed.

Further, since the rosin derivative in form of this embodiment has two or more carboxyl groups reactive on the epoxy resin, it can directly react on the epoxy resin and accordingly increase the heat resistant strength and the bonding strength of the bonding part after the soldering. Therefore, the rosin derivative can prevent separation or dropping of the element or the part and improve the reliability of the solder bonding in a wire bonding step after a semiconductor element is mounted or in the second time or later soldering step of a double-mounted type substrate bearing parts.

As the semiconductor element suitable for solder bonding using the flux of the embodiment of the invention, a power element such as an intelligent power device, a power IC, and a power transistor; other independent semiconductor elements; and IC can be exemplified.

As the electronic part suitable for solder bonding using the flux of the embodiment of the invention, a surface-mounting type small electronic part for directly mounting on the a substrate bearing parts and for example, a solder bump-bonding type semiconductor package such as a flip chip, a CSP or the like; and a chip part such as a resistor, a coil, a capacitor, and a transistor can be exemplified.

In the case of solder bonding by using a flux according to this embodiment, the flux may be used solely by applying it to a soldering part, however it is more preferable to use the flux in such a manner that the flux is mixed and kneaded with a solder alloy powder and used in form of a solder paste. After the solder paste is applied to the solder bonding part, a semiconductor element or an electronic part is mounted on the part and solder-bonded.

In the case of applying the flux according to this embodiment solely to the solder bonding part separately from a solder to carry out soldering, it is suitable for solder bonding using solder balls or reflow of a solder-precoated electrode or a preform solder.

In the case of applying the flux solely to the solder bonding part to carry out soldering, the flux function in the soldering and fixation owing to the hardening of the epoxy resin in the surrounding of the solder can simultaneously be accomplished.

In the case of carrying out solder bonding of an element or a part by using the flux in form of a paste containing a solder alloy powder kneaded with the flux, at the time of heating, the flux in the paste enters into gaps between a substrate to be bonded and either the element or the part and on completion of the soldering, the epoxy resin hardened substance fixes the element or the part.

Hereinafter, the respective components of the embodiment of the invention will be described in details.

As the epoxy resin to be used in the embodiment of the invention, those which have two or more epoxy groups in each molecule may be used without any particular limit. Practical examples are a bisphenol A type epoxy resin, a bisphenol F type epoxy resin, a phenol novolak type epoxy resin, a cresol novolak type epoxy resin, a naphthol type novolak epoxy resin, a novolak type epoxy resin of bisphenol A, a naphthalene diol type epoxy resin, an alicyclic type epoxy resin, an epoxy compound derived from tri or tetra (hydroxyphenyl)alkane, a bishydroxybiphenyl type epoxy resin, an epoxy compound of a phenol aralkyl resin and the like. These epoxy resins may be used alone or two or more of them are used in form of a mixture.

As the hardening agent to be used in the embodiment of the invention, those which are used commonly as a hardening agent for epoxy resins may be used any particular limit. Practical examples of the agent are an acid anhydride such as phthalic anhydride, hexahydrophthalic acid anhydride, tetrahydrophthalic acid anhydride, and trimellitic acid anhydride; a novolak type phenolic resin such as a phenol novolak resin, a cresol novolak resin, a tert-butylphenol novolak resin, a nonylphenol novolak resin, and a novolak resin of bisphenol A; a dicyclopentadiene-phenolic polymer; a polyfunctional phenolic resin such as a tris(bisphenoxyphenyl)alkane; a phenolic resin having a terpene skeleton structure; and an aromatic amine such as a diaminodiphenylmethane, diaminodiphenylsulfone and the like. Among them, the acid anhydride and the phenol novolak resin are particularly preferable to be used. These hardening agents may be used alone or tow or more of them may be used in combination.

The mixing ratio of the hardening agent is not particularly limited, however it is preferable adjust the equivalent ratio of the epoxy group of the above-mentioned epoxy resin and the reactive group of the hardening agent to be in a range of about 0.5 to 1.5, more preferably in a range of about 0.8 to 1.2. The reason for that is because if the ratio is out of the above-mentioned range, it becomes difficult to sufficiently cause the hardening reaction to result in decrease of the heat resistant strength and the bonding strength after the soldering.

In the embodiment of the invention, in addition to the hardening agent, a hardening accelerator can be added. As the hardening accelerator, those which are commonly used may be used without any particular limit and for example, a basic catalyst can be used. Practical examples of it are an organic phosphine compound such as trimethylphosphine, triethylphosphine, tributylphosphine, triphenylphoshine, tri(p-methylphenyl)phosphine, methyldiphenylphosphine, and tri(2, 6-dimethoxyphenyl) phosphine; an imidazole compound and its derivatives such as 2-ethylimidazole, 2,4-dimethylimidazole, 2-ethyl-4-methylimidazole, 2-phenylimidazole, and 2-heptadecylimidazole; DBU (1,8-diazabicycloundec-7-ene) or its phenolic salt, and 6-dibutylamino-1,8-diazabicycloundec-7-ene.

The mixing amount of the hardening accelerator is not particularly limited, however it is preferably about 0.01 to 10% by weight in the total of the epoxy resin and the hardening agent.

The melting points of the epoxy resin to be used in the embodiment of the invention and the hardening agent are preferably the soldering temperature or lower. That is because if the melting points exceed the soldering temperature, the hardening reaction of the epoxy resin hardly occurs at the soldering temperature and accordingly the epoxy resin cannot work as an adhesive to result in decrease of the bonding strength of the element or the part.

The combination of the epoxy resin, the hardening agent, and a hardening accelerator is preferably selected so as to harden the epoxy resin at a temperature not lower than the liquid phase line temperature of the solder alloy to be used. That is because if the epoxy resin is hardened before the solder is melted, the solder bonding is inhibited.

Further, the gelation time of the epoxy resin (the time to be taken for hardening) is preferably set within 30 minutes at the soldering temperature. That is because if the gelling time of the epoxy resin exceeds 30 minutes, the semiconductor element, a frame, a part electrode, and a substrate electrode may possibly be oxidized to result in deterioration of the function. In general, in order to shorten the assembly time of an electronic apparatus, it is required to harden the epoxy resin as quick as possible and at the soldering temperature, it is preferable to set the gelling time for the epoxy resin to be several seconds to several minutes. To shorten the gelling time of the epoxy resin, it may be possible to add the above-mentioned hardening accelerator or increase the soldering temperature to further higher.

The soldering temperature using the solder paste of the embodiment of the invention is preferably in a range of 200 to 300° C. If the soldering temperature is lower than the range, it is not desirable since the hardening time of the epoxy resin is prolonged and on the other hand, if the soldering temperature exceeds the above-mentioned range, the probability of considerably damaging the substrate to be subjected to the soldering and the parts mounted on the substrate by heat could be increased and therefore it is not preferable.

The total addition amount of the above-mentioned epoxy resin and the hardening agent in the embodiment of the invention is not particularly limited, however it is preferably 50 to 95% by weight in the entire flux. That is because if it is less than 50% by weight, the heat resistant strength and the bonding strength after soldering is insufficient and if it exceeds 95% by weight, the solderability is decreased.

The rosin derivative to be used in the embodiment of the invention is a compound selected from maleic acid-modified rosin, fumaric acid-modified rosin, and acrylic acid-modified rosin. These modified rosins are obtained by addition reaction (Diels Alder reaction) of rosins to be raw materials with maleic anhydride, fumaric acid, or acrylic acid. They have two or more carboxyl groups in each molecule and can be reacted with the epoxy resin by cross-linking reaction. As the rosins to be raw materials, natural rosins such as gum rosin, wood rosin, and tall rosin; disproportionated rosin, hydrogenated rosin, polymerized rosin, glycolic acid-modified rosin, a high purity refined rosin and the like can be exemplified. Commercialized products of such rosins are KR-85, KR-604, KR-610, KR-612, and AG-100 manufactured by Arakawa Chemical Industries, Ltd.

The addition amount of the rosin derivatives in the embodiment of the invention is not particularly limited, however it is preferably 5 to 50% by weight in the entire flux. That is because if it is less than 5% by weight, the solderability is decreased and if it exceeds 50% by weight, the heat resistant strength and the bonding strength after soldering is insufficient.

In the embodiment of the invention, other than the above-mentioned rosin derivatives, various rosin derivatives having functional groups reactive on the epoxy resin may properly be added to the extent that they do not interfere the functions of the hardenable flux such solderability and harden ability. Examples of such rosin derivatives are an epoxylated rosin, a rosin amine, a rosin amide, a rosin skeleton-containing diol compound, rosin-modified phenol resin and the like.

The epoxylated rosin is a rosin glycidyl ester obtained by reaction of rosins and glycidyl ether.

The rosin amine and rosin amide are obtained from rosins by modifying the carboxyl groups of the rosins to amino groups or amido groups.

The rosin skeleton-containing diol compound is obtained by ring-opening and addition reaction of a diepoxy compound and a rosin in 1:2 by mol ratio at 120 to 200° C. in the presence of a catalyst to adjust the acid value 5 or lower. Examples of such a diepoxy compound are ethylene glycol diglycidyl ether, diethylene glycol diglycidyl ether, triethylene glycol diglycidyl ether, polyethylene glycol diglycidyl ether, propylene glycol diglycidyl ether, dipropylene glycol diglycidyl ether, neopentyl glycol diglycidyl ether, 1,6-hexanediol diglycidyl ether, bisphenol A diglycidyl ether, bisphenol F glycidyl ether, and the like. Examples of such a catalyst may include amine type catalysts such as trimethylamine, triethylamine, tributylamine, benzyldimethylamine, pyridine, 2-imidazole and the like; quaternary ammoniums such as benzyltrimethylammonium chloride; Lewis Acid; boric acid esters; organometal compounds; organometal salts. Examples of commercialized products of the rosin skeleton-containing diol compounds obtained in such a manner are KE-601, KE-615, and KE-624 manufactured by Arakawa Chemical Industries, Ltd.

The rosin-modified phenolic resin is produced by mixing a rosin and a phenol formaldehyde initial condensate, heating the mixture at a temperature as high as 200 to 300° C., and esterifying the carboxyl groups in the rosin by glycerin, pentaerythritol, or ethylene glycol. Examples of commercialized products produced in such a manner are Tamanol 135 and 145 manufactured by Arakawa Chemical Industries, Ltd.

In addition to the above-mentioned indispensable components, the flux of the embodiment of the invention may contain additives such as an activation agent, a solvent, and a thixotropic agent based on the necessity.

Examples of the activation agent are amine halogen salts such as aniline hydrogen bromic acid salt, isopropylamine hydrochloric acid salt, ethylamine hydrochloric acid salt, diethylamine hydrogen bromic acid salt, diphenylguanidine hydrogen bromic acid salt, and cyclohexylamine hydrochloric acid salt; amine organic acid salts; organic monocarboxylic acids such as formic acid, acetic acid, myristic acid, palmitic acid, stearic acid, and benzoic acid; organic dicarboxylic acids and their anhydrides such as oxalic acid, malonic acid, succinic acid, adipic acid, fumaric acid, and maleic acid; organic amines such as hexylamine, dioctylamine, and triethylamine; and halogenated hydrocarbons. The addition amount of the activation agent is preferably in a range of 0 to 10% by weight in the entire flux.

As the solvent, alcohols, ketones, esters, and aromatic solvents can be used and practical examples of the solvent to be used are benzyl alcohol, ethanol, isopropyl alcohol, butanol, acetic acid cellosolve, ethyl cellosolve, butyl cellosolve, butyl cellosolve acetate, butyl carbitol, terpineol, toluene, xylene, propylene glycol monophenyl ether, diethylene glycol monohexyl ether, and diethylene glycol monobutyl ether. The addition ratio of the solvent may properly be adjusted so as to have a concentration and a viscosity proper for making the flux usable for the uses, in consideration of the properties of the epoxy resin and the hardening agent and in general, it is preferably in a range of 0 to 40% by weight in the entire flux.

As the thixotropic agent, cured castor oil, hydrogenated castor oil, bees wax, carnauba wax, stearic acid amide, and hydroxystearic acid ethylene bisamide can be used. In general, the mixing ratio of the thixotropic agent is preferably 0 to 10% by weight in the entire flux.

The solder paste of the embodiment of the invention is obtained by kneading the above-mentioned flux and a non-lead type solder alloy powder.

The solder alloy to be used in the embodiment of the invention is not particularly limited if it is a non-lead type solder alloy and has proper characteristics as a solder. The solder alloy can be selected from alloys of Sn, Ag, Cu, Zn, Bi, In, and Sb and representative examples are Sn—Ag type, Sn—Cu type, Sn—Zn type, Sn—Bi type, and Zn—Al—Mg—Sn type alloys.

As the above-mentioned solder alloy, those having a melting point (the liquid phase line temperature) in a range of 150 to 300° C. are preferable and those having a melting point (the liquid phase line temperature) in a range of 180 to 280° C. are more preferable. That is because in the case the melting point is too low, the solder is melted by heat generated in the power element during the use to probably result in deterioration of the reliability. On the other hand, if the melting point exceeds 300° C., since the soldering temperature is increased, the epoxy resin may not stand for the temperature in some cases.

A powder obtained by powdering such a solder alloy into a particle diameter of 4 to 100 μm, preferably 10 to 50 μm is kneaded with the above-mentioned flux to obtain a solder paste. The mixing ratio of the solder powder is preferably adjusted to be 85 to 95 parts by weight of the solder alloy powder and 5 to 15 parts by weight of the flux in 100 parts by weight in total of the solder powder and the flux.

The paste in the embodiment of the invention may contain additives such as an antioxidant, an anti-corrosion agent, or the like based on the necessity.

The antioxidant suppresses the reaction with oxygen attributed to an anti-oxidation function and a function as a radical collecting agent. In the solder paste, it takes in oxygen and thereby increases the storage stability of the paste. Further, in the reflow step, it collects the oxygen in the surrounding to prevent oxidation of the solder paste and suppress deterioration of the wettability and spreading property. On the other hand, the anti-corrosion agent has a chelating agent-like function in the paste and forms a chelating complex with the metal on the solder powder surface to protect the solder powder surface. Accordingly, increase of the viscosity attributed to the reaction of the metal component easy to be oxidized in the solder alloy with the activation agent in the flux can be prevented and thus deterioration of the storage stability of the solder paste can be prevented. During the reflow, it is effective to prevent oxidation with oxygen in the surrounding.

Organic compounds to be used for the antioxidant can be classified broadly into polymeric phenolic compounds, phosphorus compounds, and sulfur compounds. Further, organic compounds to be used for the anti-corrosion agent can be classified broadly into nitrogen compounds and sulfur compounds and the nitrogen compounds include triazoletype, imidazoletype, and guanidine type and sulfur compounds include thiazole type thiuram type, and dithiocarbamic acid salts. These antioxidants and anti-corrosion agents may be used alone or in combination.

The polymeric phenolic compounds to be used for the antioxidant may include, for example, triethylene glycol bis [3-(3-tert-butyl-5-methyl-4-hydroxyphenyl)propionate], 1,6-hexanediol bis[3-(3,5-di-tert-butyl-4-hydroxyphenyl) propionate], pentaerythrityl tetrakis[3-(3,5-di-tert-butyl-4-hydroxyphenyl)propionate], octadecyl-3-(3,5-di-tert-butyl-4-hydroxyphenyl)propionate, and 1,3,5-trimethyl-2,4,6-tris (3,5-di-tert-butyl-4-hydroxybenzyl)benzene. The phosphorus compounds may include triphenyl phosphite, trisnonyl phenyl phosphite, tris(2,4-di-tert-butylphenyl) phosphite, distearylpentaerythritol diphosphite, diphenylisodecyl phosphite and the like. The sulfur compounds may include dilauryl-3,3'-thiodipropoionate, dimyristyl-3,3'-thiodipropionate, distearyl-3,3'-thiodipropionate, dilauryl sulfide, 2-mercaptobenzimidazole, and 2-mercaptomethylbenzimidazole.

The respective antioxidants may be used alone and two or more of them are more preferably used in combination. Particularly, combination use of the polymeric phenolic compounds and phosphorus compounds and combination use of the polymeric phenolic compounds and the sulfur compounds give profoundly efficient synergetic effects. The addition amount of the antioxidant is properly in a range of 0.5 to 20% by weight in the entire flux and further preferably in a range of 1 to 10% by weight. In the case of using a plurality of antioxidants in combination, it is preferable to keep the total amount in the above-mentioned range.

The nitrogen compounds to be used as the anti-corrosion agent may include triazole compounds such as benzotriazole and methylbenzotriazole; imidazole type compounds such as imidazole, methylimidazole, and 2,4,5-triphenylimidazole; and guanidine compounds such as 1,3-diphenylguanidine. Further, the sulfur compounds may include thiazole compounds such as 2-mercaptobenzothiazole and dibenzothiazyl disulfide; thiuram compounds such as tetraethylthiuram disulfide, tetrabutylthiuram disulfide, and tetrakis(2-ethylhexyl) thiuram disulfide; thiourea type compounds such as N,N'-diphenylthiourea; and dithiocarbamic acid salt.

These anti-corrosion agents may be use alone or two or more of them may be used in combination. The addition amount of the anti-corrosion agent is properly in a range of 0.1 to 10% by weight, more preferably in a range of 0.5 to 5% by weight, in the entire flux.

However, the total of the above-mentioned antioxidant and anti-corrosion agent is properly in a range of 1 to 30% by weight in the entire flux. If the addition amount is too low, the oxidation prevention effect and the storage stabilization effect are not so sufficient and if it is excess, the protection for the solder metal particles is so firm as to possibly inhibit the activation power and deteriorate wettability and the spreading property.

The solder paste of the embodiment of the invention can be obtained by preparing the flux by evenly mixing the above-mentioned flux composing components in a common manner and further kneading the flux with the solder alloy powder. In the flux preparation, if the epoxy resin and the hardening agent are liquid at a room temperature, mixing can be carried out easily by adding only the indispensable components, however if the epoxy resin or the hardening agent are solids in a room temperature and difficult to be mixed, a proper solvent may be added to make the mixing easy.

The flux and the solder paste of the embodiment of the invention can be used efficiently by a normal method as a solder for reflow type soldering at the time of producing a solder-mounted material and an electronic part of a semiconductor element, an electronic module, and a printed circuit substrate.

Hereinafter, a method for carrying out soldering using the above-mentioned solder paste will be described. A wiring substrate such as a glass epoxy resin composite substrate on whose surface printed wiring is formed is made ready and the solder paste is applied to a part of the substrate where the solder bonding is carried out, that is an electrode part of the like where solder bonding is carried out with a terminal of a part to be disposed in the substrate. As described above, the solder paste is preferably a solder paste comprising a thermosetting flux containing an epoxy resin, a hardening agent, and at least one kind of rosin derivatives selected from maleic acid-modified rosin, a fumaric acid-modified rosin, and acrylic acid-modified rosin having functional groups reactive with the epoxy resin and a non-lead type solder alloy powder.

The solder paste application can be carried out by employing a known method such as a screen printing method or the like.

The solder paste is applied to the object part of a substrate having an electrode to be bonded and then mounting an object part to be bonded on the substrate.

Next, the substrate and the mounted part are pre-heated at 150 to 180° C. for 0.1 to 10 minutes. Further, they are heated at 200 to 300° C. for 0.1 to 30 minutes. In these steps, the epoxy resin contained in the solder paste is hardened to stick the substrate and the mounted part and simultaneously carry out solder bonding and accordingly the substrate in which the part is mounted mechanically and electrically firmly can be obtained.

As described above in details, a flux of an embodiment make it possible to firmly bond a semiconductor element or an electronic part simultaneously with soldering when it is used at the time of soldering of the semiconductor element or the electronic part and also can provide a solder paste having good soldering ability, suitable for solder bonding of the semiconductor element or the electronic part, and excellent in the bonding strength and the heat resistant strength at a high temperature. Further, the solder paste of the invention can be used as a substituting bonding material for the solder paste and is provided with a profoundly desirable industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Hereinafter, the invention will be described more in details. The invention is not limited to these examples.

Examples 1 to 6 and Comparative Examples 1 to 3

[Preparation of Fluxes]

The following components were used as the raw material of fluxes.

Epoxy resin A: Bisphenol A type epoxy resin (Epikote 828, epoxy equivalent 190, liquid phase; manufactured by Japan Epoxy resin Co., Ltd.)

Epoxy resin B: o-Crosol novolak type epoxy resin (ESCN-195 XL, epoxy equivalent 197, solid phase, manufactured by Sumitomo Chemical Co., Ltd.)

Hardening agent A: Methyltetrahydrophthalic acid anhydride (MH-700, acid anhydride equivalent 168, liquid phase, manufactured by New Japan Chemical Co., Ltd.)

Hardening agent B: Phenol novolak resin (BRG-556, hydroxyl equivalent 104, solid phase, manufactured by Showa Highpolymer Co., Ltd.)

Hardening accelerator: 2-Heptadecylimidazole (C17Z, manufactured by Shikoku Chemicals Corp.)

Rosin derivative A: Maleic acid (anhydride)-modified rosin (acid value 366)

Rosin derivative B: Fumaric acid-modified rosin (acid value 362)

Rosin derivative C: Acrylic acid-modified rosin (acid value 265)

Rosin derivative D: Rosin ester (KE-100, having no functional group; manufactured by Arakawa Chemical Industries, Ltd.)

Rosin: Polymerized rosin

Solvent: Propylene glycol monophenyl ether

Activation agent: Diethylamine hydrogen bromic acid salt

Thixotropic agent: Hydrogenated castor oil

Antioxidant A: Pentaerythrityl tetrakis[3-(3,5-di-tert-butyl-4-hydroxyphenyl)propionate]

Antioxidant B: tris(2,4-di-tert-butylphenyl)phosphite

Anti-corrosion agent: methylbenzotriazole

These components were mixed at ratios (% by weight) as described in the following Table 1 and Table 2, loaded into containers, and stirred and kneaded to obtain fluxes.

[Preparation of Solder Pastes]

As non-lead type solder alloy powders, powders of Sn-3.0 Ag-0.5 Cu alloy (melting point: 220° C.), Sn-0.7 Cu alloy (melting point: 229° C.), and Sn-9 Zn alloy (melting point: 199° C.) with particle diameters of 20 to 40 μm were used and the solder alloy powders 90 parts by weight and the above-mentioned fluxes 10 parts by weight were mixed and stirred by a kneader to produce solder pastes.

[Evaluation of Solder Pastes]

Nine types of solder pastes of Examples 1 to 6 and Comparative Examples 1 to 3 produced in the above-mentioned manner were subjected to the following evaluation tests.

(1) Evaluation of Solder Spreading Ratio

The solder spreading ratio was measured according to JIS Z 3197. A common copper plate was used for the evaluation.

(2) Evaluation of Bonding Strength

Each solder paste was applied to an electrode potion formed at prescribed position of a glass epoxy substrate by a screen printing method and a 2,125 type chip part was mounted. Next, in a reflow furnace, preheating was carried out at 170° C. for 1 minute and then reflow was carried out by heating at a temperature of 200° C. or higher, at highest 240° C., for 40 seconds to complete the soldering.

The load (gf) at the moment when the part was separated by applying the force to the part in the transverse direction was determined to be a bonding strength. The bonding strength measurement was carried out by using a fixative strength tester.

(3) Evaluation of Heat Resistant Strength at High Temperature

A silicon chip of 2×2 mm was mounted on a copper frame using each solder paste and further mounted on a hot plate heated to 250° C. and after it was confirmed that the solder alloy was melted, the chip was slightly pushed to complete the soldering. After that the hot plate was heated to 300° C. to carry out hot temperature treatment simulating the wire bonding and occurrence of separation in the bonded part was observed. In the case the bonded part was separated, NG was marked and in the case no separation was observed and bonding was found good, OK was marked.

(4) Evaluation of Thermal Conductivity

After the soldering, the solder bonded body in the bonded part was cut and the thermal conductivity was measured by a laser flash method.

The obtained evaluation results were shown in the following Table 1 and Table 2.

TABLE 1

| | | Example | | | | | |
|---|---|---|---|---|---|---|---|
| | | 1 | 2 | 3 | 4 | 5 | 6 |
| Flux composition (wt. %) | Epoxy resin A | 45 | 45 | 40 | — | — | — |
| | Epoxy resin B | — | — | — | 42 | 40 | 40 |
| | Hardening agent A | 36 | 36 | 32 | — | — | — |
| | Hardening agent B | — | — | — | 19 | 18 | 18 |
| | Hardening accelerator | 1 | 1 | 1 | 1 | 1 | 1 |
| | Rosin derivative A | 17 | — | — | 17 | — | — |
| | Rosin derivative B | — | 17 | — | — | 13 | — |
| | Rosin derivative C | — | — | 26 | — | — | 17 |
| | Solvent | — | — | — | 20 | 20 | 20 |
| | Activation agent | 1 | 1 | 1 | 1 | 1 | 1 |
| | Antioxidant A | — | — | — | — | 5 | — |
| | Antioxidant B | — | — | — | — | 2 | — |
| | Anti-corrosion agent | — | — | — | — | — | 3 |
| Flux (parts by weight) | | 10 | 10 | 10 | 10 | 10 | 10 |
| Solder powder (parts by weight) | Sn—3.0Ag—0.5Cu | 90 | 90 | — | — | — | — |
| | Sn—0.7Cu | — | — | 90 | 90 | — | — |
| | Sn—9Zn | — | — | — | — | 90 | 90 |
| Evaluation results | Solder spreading ratio (%) | 92 | 91 | 91 | 90 | 92 | 92 |
| | Bonding strength (gf) | 1000 | 1200 | 1100 | 1000 | 1200 | 1000 |
| | Heat resistant strength at high temperature | OK | OK | OK | OK | OK | OK |
| | Thermal conductivity (W/mK) | 32 | 30 | 32 | 35 | 34 | 32 |

TABLE 2

| | | Comparative Example | | | |
|---|---|---|---|---|---|
| | | 1 | 2 | 3 | 4 |
| Flux composition (wt. %) | Epoxy resin A | — | 50 | 45 | 50 |
| | Epoxy resin B | — | — | — | — |
| | Hardening agent A | — | 48 | 36 | 48 |
| | Hardening agent B | — | — | — | — |
| | Hardening accelerator | — | 2 | 1 | 2 |
| | Polymerized rosin | 59 | — | — | — |
| | Rosin derivative A | — | — | — | — |
| | Rosin derivative B | — | — | — | — |
| | Rosin derivative C | — | — | — | — |
| | Rosin derivative D (having no functional group) | — | — | 17 | — |
| | Solvent | 35 | — | — | — |
| | Activation agent | 1 | — | 1 | — |
| | Thixotropic agent | 5 | — | — | — |
| Flux (parts by weight) | | 10 | 10 | 10 | 10 |
| Solder powder (parts by weight) | Sn—3.0Ag—0.5Cu | 90 | 90 | 90 | — |
| | Sn—0.7Cu | — | — | — | — |
| | Sn—9Zn | — | — | — | — |
| Silver powder (parts by weight) | | — | — | — | 90 |
| Evaluation results | Solder spreading ratio (%) | 92 | 60 | 90 | — |
| | Bonding strength (gf) | 400 | 1200 | 800 | 1200 |
| | Heat resistant strength at high temperature | NG | OK | NG | OK |
| | Thermal conductivity (W/mK) | 64 | 25 | 30 | 10 |

As shown in Table 1, the solder pastes using the fluxes in the invention were found showing good wettability and spreading property and having high bonding strength of the elements or the parts to the bonded substrate. Further, no separation in the bonded part took place by the high temperature treatment, showing the high bonding strength.

On the other hand, as shown in Table 2, the bonding strength and heat resistant strength were low in the case of using a conventional rosin type flux (Comparative Example 1) and the wettability and spreading property were insufficient in the case of using no rosin derivative (Comparative Example 2). Further, in the case of using the rosin derivative having no reactivity on the epoxy resin (Comparative Example 3), the heat resistant strength was inferior, so that the bonded part was separated at the high temperature. Further, in the case of using a conductive adhesive of the Comparative Example 4 (as the conductive particle, a silver powder with a particle diameter of 5 to 15 μm was used), the thermal conductivity was insufficient and in the case of using it for bonding a power element, it was found that heat generated in the power element could not efficiently be released.

The invention claimed is:

1. A soldering method comprising:
    applying a solder paste comprising a thermosetting flux containing an epoxy resin, a hardening agent, a non-lead type solder alloy powder, and at least one rosin derivative having at least two carboxyl groups reactive on the epoxy resin and selected from a maleic acid-modified rosin, a fumaric acid-modified rosin, and an acrylic acid-modified rosin to an object part of a substrate having an electrode to be bonded, then mounting an object part to be bonded on the substrate;

pre-heating the substrate and the mounted part at 150 to 180° C. for 0.1 to 10 minutes; and heating the resulting substrate and the mounted part at 200 to 300° C. for 0.1 to 30 minutes.

2. The soldering method according to claim 1, wherein the object part to be bonded is a power semiconductor element.

3. The soldering method according to claim 1, wherein the addition amount of the thermosetting flux to the solder paste is not more than 5 parts by weight and not less than 15 parts by weight to 100 parts by weight of the solder paste.

4. The soldering method according to claim 1, wherein melting points of the epoxy resin and the hardening agent are the melting point of the non-lead type solder alloy or lower.

5. The soldering method according to claim 1, wherein the hardening temperature of the epoxy resin in the solder paste is the melting point of the non-lead type solder alloy or higher.

6. The soldering method according to claim 1, wherein hardening time of the epoxy resin is within 30 minutes at the soldering temperature.

7. The soldering method according to claim 1, wherein the non-lead type solder alloy has a melting point in a range of 150 to 30° C.

8. The soldering method according to claim 7, wherein the non-lead type solder alloy has a melting point in a range of 180 to 280° C.

9. The soldering method according to claim 1, wherein the solder paste comprises at least one agent selected from the group consisting of an antioxidant and an anti-corrosion agent.

* * * * *